(12) United States Patent
Park et al.

(10) Patent No.: US 11,566,344 B2
(45) Date of Patent: Jan. 31, 2023

(54) SILICON CARBIDE INGOT, WAFER, METHOD FOR PRODUCING A SILICON CARBIDE INGOT, AND METHOD FOR MANUFACTURING A WAFER

(71) Applicant: SENIC INC., Cheonan-si (KR)

(72) Inventors: Jong Hwi Park, Suwon-si (KR); Jongmin Shim, Hwaseong-si (KR); Eun Su Yang, Suwon-si (KR); Yeon Sik Lee, Suwon-si (KR); Byung Kyu Jang, Suwon-si (KR); Jung Woo Choi, Suwon-si (KR); Sang Ki Ko, Suwon-si (KR); Kap-Ryeol Ku, Suwon-si (KR); Jung-Gyu Kim, Suwon-si (KR)

(73) Assignee: SENIC INC., Cheonan-si (KR)

( * ) Notice: Subject to any disclaimer, the term of this patent is extended or adjusted under 35 U.S.C. 154(b) by 215 days.

(21) Appl. No.: 17/193,596

(22) Filed: Mar. 5, 2021

(65) Prior Publication Data

US 2021/0388527 A1 Dec. 16, 2021

(30) Foreign Application Priority Data

Jun. 16, 2020 (KR) .................. 10-2020-0072846

(51) Int. Cl.
*C30B 29/36* (2006.01)
*C30B 23/02* (2006.01)
*C30B 33/00* (2006.01)

(52) U.S. Cl.
CPC ............ *C30B 29/36* (2013.01); *C30B 23/025* (2013.01); *C30B 33/00* (2013.01)

(58) Field of Classification Search
CPC ........ C30B 23/025; C30B 29/36; C30B 33/00
See application file for complete search history.

(56) References Cited

FOREIGN PATENT DOCUMENTS

| | | |
|---|---|---|
| CN | 105658846 A | 6/2016 |
| JP | 2007-290880 A | 11/2007 |
| JP | 4585359 B2 | 11/2010 |
| JP | 2015-59072 A | 3/2015 |
| JP | 2015-157762 A | 9/2015 |
| JP | 2016-52961 A | 4/2016 |
| JP | 2016-164120 A | 9/2016 |
| JP | WO2017/057742 A1 | 4/2017 |
| JP | 2019-156708 A | 9/2019 |
| KR | 10-2010-0089103 A | 8/2010 |
| KR | 10-2012-0033261 A | 4/2012 |
| KR | 10-2016-0049432 A | 5/2016 |
| KR | 10-2016-0055102 A | 5/2016 |
| KR | 10-2016-0058867 A | 5/2016 |
| KR | 10-2017-0012272 A | 2/2017 |
| KR | 10-2017-0031268 A | 3/2017 |
| KR | 10-2017-0073606 A | 6/2017 |
| KR | 10-2017-0076763 A | 7/2017 |
| KR | 10-2068933 B1 | 1/2020 |
| KR | 10-2104751 B1 | 4/2020 |

*Primary Examiner* — Elizabeth E Mulvaney
(74) *Attorney, Agent, or Firm* — NSIP Law

(57) ABSTRACT

A wafer having relaxation moduli different by 450 GPa or less, as determined by dynamic mechanical analysis, when loaded to 1 N and 18 N with a loading rate of 0.1 N/min at a temperature of 25° C.

20 Claims, 5 Drawing Sheets

SILICON CARBIDE INGOT, WAFER, METHOD FOR PRODUCING A SILICON CARBIDE INGOT, AND METHOD FOR MANUFACTURING A WAFER

CROSS-REFERENCE TO RELATED APPLICATIONS

This application claims the benefit under 35 USC 119(a) of Korean Patent Application No. 10-2020-0072846 filed on Jun. 16, 2020, in the Korean Intellectual Property Office, the entire disclosure of which is incorporated herein by reference for all purposes.

BACKGROUND

1. Field

The present disclosure relates to a silicon carbide ingot with excellent physical properties, a wafer with excellent physical properties, a method for producing a silicon carbide ingot, and a method for manufacturing a wafer.

2. Description of the Background

Silicon carbide (SiC) has a wide band gap of 2.2 eV to 3.3 eV and is currently being investigated and developed as a semiconductor material due to its excellent physical and chemical properties.

Single-crystal silicon carbide is prepared by various processes such as liquid phase epitaxy (LPE), chemical vapor deposition (CVD), and physical vapor transport (PVT). According to physical vapor transport, silicon carbide as a raw material is loaded into a crucible, a seed crystal composed of single-crystal silicon carbide is arranged at the top end of the crucible, the crucible is heated by induction to sublimate the raw material, and as a result, single-crystal silicon carbide is grown on the seed crystal.

Physical vapor transport enables fast growth of single-crystal silicon carbide to produce silicon carbide ingots. Due to this advantage, physical vapor transport is most widely used for the production of silicon carbide ingots. However, since various factors such as characteristics of a crucible and process conditions change the current density in the crucible and the internal temperature distribution of the crucible, there may be a difficulty in ensuring uniform physical properties of a final silicon carbide ingot.

This description of the background may be technical information possessed by the inventors to derive example embodiments described herein or acquired during the derivation of example embodiments and is not necessarily publicly known prior to the filing of the present application.

Korean Patent Publication No. 10-2017-0076763 discloses a method for producing a silicon carbide single crystal and a silicon carbide single crystal substrate, and Korean Patent Publication No. 10-2010-0089103 discloses a silicon carbide single crystal ingot, and a substrate and an epitaxial wafer obtained from the silicon carbide single crystal ingot.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a wafer has relaxation moduli different by 450 GPa or less, as determined by dynamic mechanical analysis, when loaded to 1 N and 18 N with a loading rate of 0.1 N/min at a temperature of 25° C.

The wafer may have a relaxation modulus of 1510 GPa to 1800 GPa when loaded to 1 N with a loading rate of 0.1 N/min at a temperature of 25° C.

The wafer may have a relaxation modulus of 1800 GPa to 1960 GPa when loaded to 18 N with a loading rate of 0.1 N/min at a temperature of 25° C.

The wafer may have a relaxation modulus of 1510 GPa to 1960 GPa when loaded to 1 N to 18 N with a loading rate of 0.1 N/min at a temperature of 25° C.

The wafer may have a stiffness of 51.3 kN/m to 70.0 kN/m, as determined by dynamic mechanical analysis, when loaded to 1 N to 18 N with a loading rate of 0.1 N/min at a temperature of 25° C.

The wafer may have a creep compliance of 0.508 $\mu m^2/N$ to 0.643 $\mu m^2/N$, as determined by dynamic mechanical analysis, when loaded to 1 N to 18 N with a loading rate of 0.1 N/min at a temperature of 25° C.

The wafer may have a creep compliance of 0.60 $\mu m^2/N$ to 0.63 $\mu m^2/N$ when loaded to 1 N with a loading rate of 0.1 N/min at a temperature of 25° C.

The wafer may have a creep compliance of 0.52 $\mu m^2/N$ to 0.55 $\mu m^2/N$ when loaded to 18 N with a loading rate of 0.1 N/min at a temperature of 25° C.

The wafer may have a diameter of 4 inches or more and may be composed of 4H silicon carbide.

In another general aspect, a method for manufacturing a wafer includes arranging a raw material and a silicon carbide seed crystal to face each other in a reactor having an internal space, controlling the temperature, pressure, and atmosphere of the internal space to sublimate the raw material and grow a silicon carbide ingot from the seed crystal, cooling the reactor and recovering the silicon carbide ingot, grinding the edge of a silicon carbide ingot, and cutting the ground silicon carbide ingot into a wafer, wherein the silicon carbide ingot includes one surface and an other surface facing each other, wherein the one surface is flat or convex, wherein the wafer is prepared from a portion below the one surface, and wherein the wafer has relaxation moduli different by 450 GPa or less, as determined by dynamic mechanical analysis, when loaded to 1 N and 18 N with a loading rate of 0.1 N/min at a temperature of 25° C.

The thermal conductivity of the reactor may be 120 W/mK or less.

A flow may be created in a direction from the raw material towards the silicon carbide seed crystal during the cooling.

The wafer may have a creep compliance of 0.508 $\mu m^2/N$ to 0.643 $\mu m^2/N$, as determined by dynamic mechanical analysis, when loaded to 1 N to 18 N with a loading rate of 0.1 N/min at a temperature of 25° C.

A heat insulating material surrounding an outer surface of the reactor may have a porosity of 72% to 95%.

The heat insulating material may have a compressive strength of 0.2 MPa or more.

In another general aspect, a method of producing an ingot includes disposing a raw material and a silicon carbide seed crystal facing each other in an internal space of a reactor, sublimating the raw material to grow a silicon carbide ingot from the seed crystal in the internal space, and cooling the reactor and recovering the silicon carbide ingot, wherein during the sublimating, inert gas flows in a direction from the raw material towards the silicon carbide seed crystal at a flow rate of 70 sccm or more and 330 sccm or less, and/or during the cooling, inert gas flows in a direction from the raw material towards the silicon carbide seed crystal at a flow rate of 1 sccm or more and 300 sccm or less.

A method of manufacturing a wafer may include grinding the edge of the silicon carbide ingot, and cutting the ground silicon carbide ingot into the wafer, wherein the wafer comprises relaxation moduli different by 450 GPa or less, as determined by dynamic mechanical analysis, when loaded to 1 N and 18 N with a loading rate of 0.1 N/min at a temperature of 25° C.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
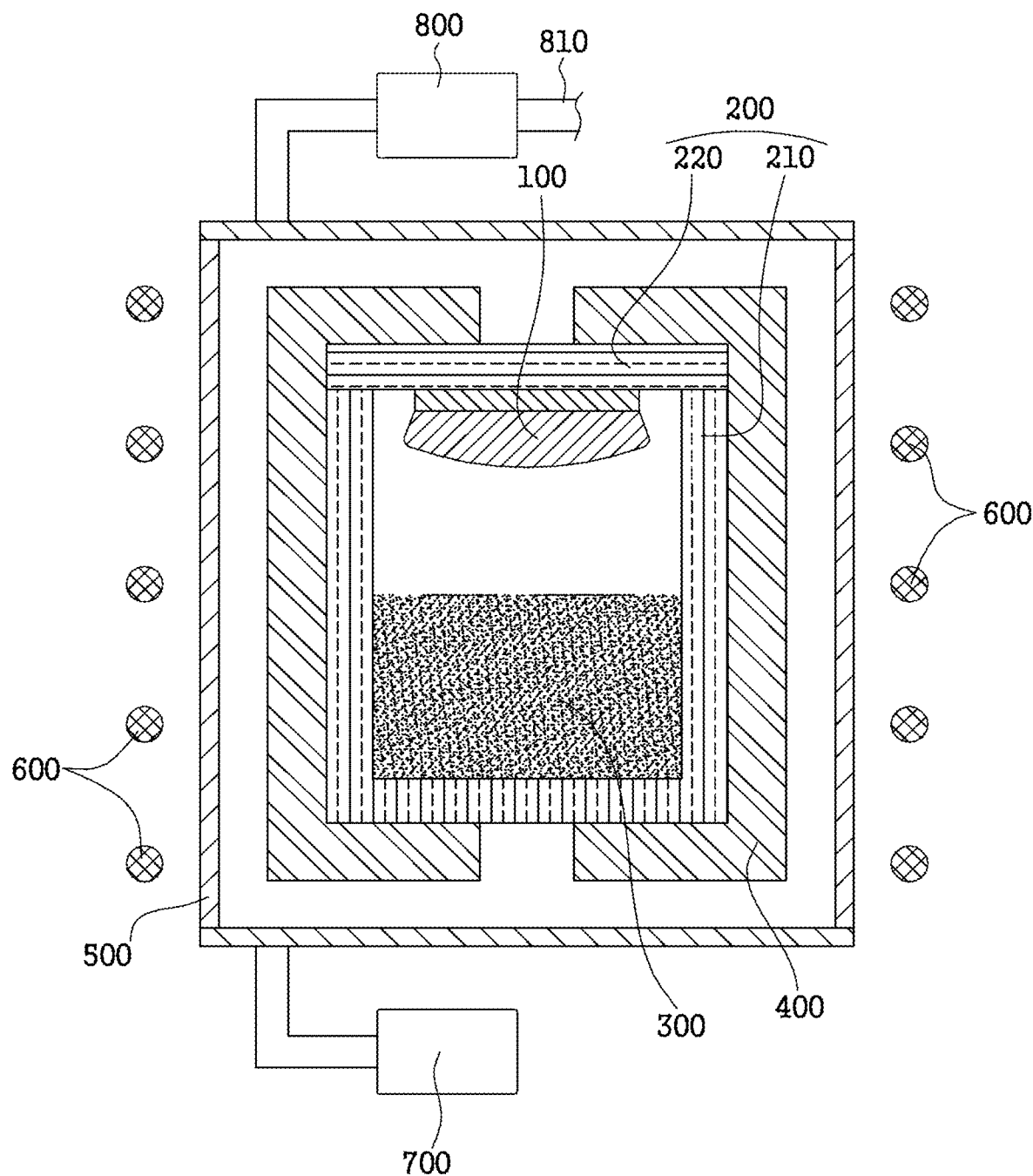
FIG. 1 is a conceptual view illustrating an example of a system for producing a silicon carbide ingot according to one or more example embodiments.

Hereinafter, while examples of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

In example embodiments, the term "combination of" included in Markush type description means mixture or combination of one or more elements described in Markush type and thereby means that the disclosure includes one or more elements selected from the Markush group.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example, for example, as to what an example may include or implement, means that at least one example exists in which such a feature is included or implemented while all examples are not limited thereto.

The features of the examples described herein may be combined in various ways as will be apparent after an understanding of this disclosure. Further, although the examples described herein have a variety of configurations, other configurations are possible as will be apparent after an understanding of this disclosure.

The term "wafer" as used herein refers to a so-called bare wafer unless otherwise specifically mentioned.

The term "difference" as used herein refers to the value obtained by subtracting a smaller number from a larger one and is expressed as a positive number.

One object of one or more example embodiments described herein is to provide a silicon carbide ingot and a wafer that avoid the possibility of deformation and breakage caused by various stress factors and have excellent elastic modulus and creep properties.

A further object of one or more example embodiments described herein is to provide a silicon carbide ingot and a wafer that have low defect levels such as low dislocation densities and have good quality.

One or more example embodiments will now be described in more detail.

Ingots and wafers manufactured therefrom are likely to be deformed, defective or broken, for example, during transport, machining or processing. The quality of epitaxial layers may deteriorate in subsequent processes for device fabrication.

The investigations disclosed herein focused on elastic modulus and creep properties as solutions to such problems, and as a result, found that a silicon carbide ingot and a wafer with improved elastic modulus and creep properties can be protected from deformation, defects or breakage possibly caused by external stress factors.

The investigations disclosed herein have also found that various factors (such as controlled flow of an inert gas and temperature gradient of a crucible) are particularly important for the growth of silicon carbide by physical vapor transport, and control over these factors enables the manufacture of a silicon carbide ingot of one or more example embodiments having desired characteristics, and described herein are one or more example embodiments based on this finding.

Silicon Carbide Ingot 100

In one aspect, a silicon carbide ingot 100 according to one or more example embodiments disclosed herein includes one surface 110 and an other surface 120 facing each other wherein the one surface is defined as an upper surface and is flat or convex, a wafer is prepared from the portion below the one surface, and the wafer has relaxation moduli different by 450 GPa or less, as determined by dynamic mechanical analysis, when loaded to 1 N and 18 N with a loading rate of 0.1 N/min at a temperature of 25° C.

The silicon carbide ingot 100 is produced by sublimating a raw material in a reactor, recrystallizing the sublimated raw material on a silicon carbide seed crystal, and growing the crystal.

Figure 2:
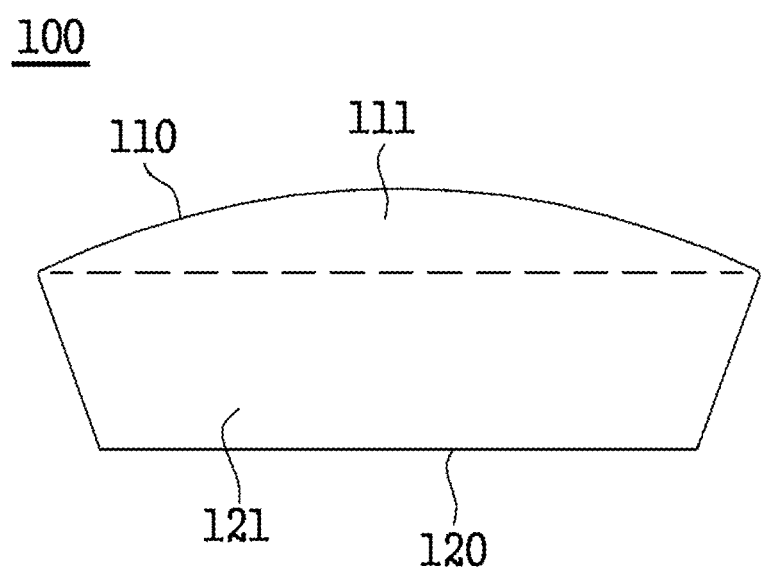
FIG. 2 is a conceptual cross-sectional view illustrating the shape of an ingot produced by a method according to one or more example embodiments.

Referring to FIG. 2, the surface of the silicon carbide ingot facing the raw material after completion of the growth is defined as the one surface 110. The one surface may be convex or flat.

The silicon carbide ingot 100 may include a body 121 and a protrusion 111 extending from the body. When the protruding surface of the silicon carbide ingot 100 is defined as an upper surface, the portion under the protruding surface corresponds to the body.

That is, when the one surface 110 of the silicon carbide ingot is defined as an upper surface, the bottom surface where the silicon carbide ingot begins to grow can be considered as the other surface 120. The other surface can be defined as a lower surface. The portion below the one surface is cut to a predetermined thickness to prepare a wafer. Here, the portion is cut at a predetermined off angle with respect to the other surface or the (0001) plane of the silicon carbide ingot.

The wafer can be manufactured by trimming the outer diameter surface of the silicon carbide ingot 100 using a grinding machine in a direction inward from the outer diameter surface, cutting the silicon carbide ingot to a predetermined thickness at a predetermined off angle with respect to the other surface 120 or the (0001) plane thereof, followed by edge grinding and surface processing such as abrasion or polishing.

The off angle with respect to the other surface 120 or the (0001) plane may be 0° to 10°. The wafer may have a rocking angle of −1.5° to 1.5°, −1.0° to 1.0°, −0.5° to 0.5°, or −0.3° to 0.3° with respect to a reference angle. Within this range, high crystal quality of the wafer is ensured. That is, the crystallinity of the wafer can be evaluated by the rocking angle. The rocking angle can be determined by the following procedure. First, the [11-20] direction of the wafer is adjusted to the X-ray path using a high-resolution X-ray diffraction system (HR-XRD system). The X-ray source optic and X-ray detector optic angles are set to 2θ (35° to 36°). Thereafter, a rocking curve is measured by controlling the omega (ω) or theta (θ) (X-ray detector optic) angle depending on the off angle of the wafer. The peak angle is defined as a reference angle. The differences between the reference angle and two full width at half maximum (FWHM) values are set to the rocking angle range.

As used herein, the expression "off angle of X°" means that the off angle is X° with a generally allowable error range. For example, the off angle is in the range of (X°−0.05°) to (X°+0.05°). As used herein, the expression "rocking angle of −1° to 1° with respect to a reference angle" means that the full width at half maximum (FWHM) values are in the range of −1° to +1° with respect to the peak angle as a reference angle (that is, (peak angle−1°) to (peak) angle+1°). The rocking angle is determined by dividing the surface of the wafer, except for the central portion of the wafer and the portion 5 mm distant from the edge in the direction toward the center, into three substantially equal portions, measuring rocking angles at least three times in each of the portions, and averaging the measured results. Specifically, when the wafer is cut at an off angle of 0° to 10° with respect to the bottom surface as the other surface 120 of the silicon carbide ingot 100, the omega angle is 17.8111° for an off angle of 0°, 13.811° for an off angle of 4°, and 9.8111° for an off angle of 8°.

The wafer prepared from the silicon carbide ingot 100 by cutting has relaxation moduli different by 450 GPa or less, 400 GPa or less, or 350 GPa or less, as determined by dynamic mechanical analysis, when loaded to 1 N and 18 N with a loading rate of 0.1 N/min at a temperature of 25° C. When the relaxation modulus difference of the wafer is as defined above, the occurrence of deformation and distortion can be minimized under time-dependent loading conditions.

The wafer may have a relaxation modulus of 1510 GPa to 1800 GPa when loaded to 1 N with a loading rate of 0.1 N/min at a temperature of 25° C.

The wafer may have a relaxation modulus of 1800 GPa to 1960 GPa when loaded to 18 N with a loading rate of 0.1 N/min at a temperature of 25° C.

The wafer may have a relaxation modulus of 1510 GPa to 1960 GPa or 1540 GPa to 1930 GPa when loaded to 1 N to 18 N with a loading rate of 0.1 N/min at a temperature of 25° C. The wafer may have a relaxation modulus of 1570 GPa to 1920 GPa when loaded to 1 N to 18 N with a loading rate of 0.1 N/min at a temperature of 25° C.

The relaxation modulus is an extended definition of elastic modulus and can be interpreted as the elastic modulus with time. The relaxation modulus can be represented as a sum of exponential functions, G(t), given by Equation 1:

$$G(t) = \sum_i G_i \exp\left(-\frac{t}{\tau_i}\right) \quad (1)$$

In Equation 1, $G_i$ is the relaxation strength, $\tau_i$ is the relaxation time, and t is the time.

When the relaxation modulus difference of the wafer is as defined above, the occurrence of deformation and distortion can be minimized and the formation of defects can be reduced under time-dependent loading conditions.

The wafer may have a creep compliance of 0.508 μm²/N to 0.643 μm²/N or 0.522 μm²/N to 0.627 μm²/N, as determined by dynamic mechanical analysis, when loaded to 1 N to 18 N with a loading rate of 0.1 N/min at a temperature of 25° C. The wafer may have a creep compliance of 0.52 μm²/N to 0.63 μm²/N, as determined by dynamic mechanical analysis, when loaded to 1 N to 18 N with a loading rate of 0.1 N/min at a temperature of 25° C.

The wafer may have a creep compliance of 0.60 μm²/N to 0.63 μm²/N when loaded to 1 N with a loading rate of 0.1 N/min at a temperature of 25° C.

The wafer may have a creep compliance of 0.52 μm²/N to 0.55 μm²/N when loaded to 18 N with a loading rate of 0.1 N/min at a temperature of 25° C.

The creep compliance represents the time-dependent size of deformation caused by unit stress.

When the creep compliance of the wafer is as defined above, deformation possibly caused by stress is controlled to an optimal level so that the possibility of damage to the wafer caused by external forces can be minimized and the formation of defects in the wafer can be reduced.

The wafer may have stiffnesses different by 12 kN/m or less or 11 kN/m or less, as determined by dynamic mechanical analysis, when loaded to 1 N and 18 N with a loading rate of 0.1 N/min at a temperature of 25° C. The wafer may have stiffnesses different by 10.5 kN/m or less, as determined by dynamic mechanical analysis, when loaded to 1 N and 18 N with a loading rate of 0.1 N/min at a temperature of 25° C.

The wafer may have a stiffness of 51.3 kN/m to 57.5 kN/m, as determined by dynamic mechanical analysis, when loaded to 1 N with a loading rate of 0.1 N/min at a temperature of 25° C.

The wafer may have a stiffness of 62 kN/m to 68 kN/m, as determined by dynamic mechanical analysis, when loaded to 18 N with a loading rate of 0.1 N/min at a temperature of 25° C.

The wafer may have a stiffness of 51.3 kN/m to 70 kN/m or 54 kN/m to 67 kN/m, as determined by dynamic mechanical analysis, when loaded to 1 N to 18 N with a loading rate of 0.1 N/min at a temperature of 25° C.

When the stiffness of the wafer is as defined above, the degree of deformation possibly caused by external forces is controlled to an optimal level so that a balance between the durability and processability of the wafer can be achieved.

When the relaxation modulus, creep compliance, and stiffness of the wafer are as defined above, the occurrence of deformation and defects of the wafer can be minimized during transport, machining or processing. In addition, the quality of a silicon carbide epitaxial layer to be formed by a subsequent process can be improved.

The wafer may have a micropipe (MP) density of 1.5/cm² or less or 1/cm² or less.

The wafer may have a threading edge dislocation (TED) density of 10,000/cm² or less or 8,000/cm² or less.

The wafer may have a basal plane dislocation (BPD) density of 5,000/cm² or less or 3,000/cm² or less.

When the defect densities of the wafer are as defined above, the wafer is of high quality with few defects and can be used to fabricate a device with excellent electrical or optical properties.

The defect densities of the wafer can be measured by imaging the surface after the addition of an etchant and details are described in the Experimental Examples section that follows.

The thickness of the wafer may be 300 μm to 600 μm, which is suitably applicable to semiconductor devices, but is not limited thereto.

The wafer 10 may be composed substantially of 4H single-crystal SiC in which a minimal number of defects or polymorphs are incorporated.

The silicon carbide wafer 100 may have a diameter of 4 inches or more, 5 inches or more or 6 inches or more. The diameter of the silicon carbide wafer may be 4 inches to 12 inches, 4 inches to 10 inches, or 4 inches to 8 inches. Depending on these characteristics, the silicon carbide seed crystal can be appropriately selected for the production of the silicon carbide ingot.

The silicon carbide ingot 100 can be grown from the C plane ((000-1) plane) of the silicon carbide seed crystal.

The silicon carbide ingot 100 can be produced using controlled amounts of an inert gas used in the growth and cooling steps and a crucible whose thermal conductivity is in a specific range, and details are described below.

Wafer

In a further aspect, a wafer according to one or more example embodiments disclosed herein has relaxation moduli different by 450 GPa or less, as determined by dynamic mechanical analysis, when loaded to 1 N and 18 N with a loading rate of 0.1 N/min at a temperature of 25° C.

The wafer may have relaxation moduli different by 450 GPa or less, 400 GPa or less, or 350 GPa or less, as determined by dynamic mechanical analysis, when loaded to 1 N and 18 N with a loading rate of 0.1 N/min at a temperature of 25° C. When the relaxation modulus difference of the wafer is as defined above, the occurrence of deformation and distortion can be minimized under time-dependent loading conditions.

The wafer may have a relaxation modulus of 1510 GPa to 1800 GPa when loaded to 1 N with a loading rate of 0.1 N/min at a temperature of 25° C.

The wafer may have a relaxation modulus of 1800 GPa to 1960 GPa when loaded to 18 N with a loading rate of 0.1 N/min at a temperature of 25° C.

The wafer may have a relaxation modulus of 1510 GPa to 1960 GPa when loaded to 1 N to 18 N with a loading rate of 0.1 N/min at a temperature of 25° C. The wafer may have a relaxation modulus of 1570 GPa to 1920 GPa when loaded to 1 N to 18 N with a loading rate of 0.1 N/min at a temperature of 25° C.

The wafer may have a creep compliance of 0.508 μm²/N to 0.643 μm²/N or 0.522 μm²/N to 0.627 μm²/N, as determined by dynamic mechanical analysis, when loaded to 1 N to 18 N with a loading rate of 0.1 N/min at a temperature of 25° C. The wafer may have a creep compliance of 0.527 μm²/N to 0.630 μm²/N, as determined by dynamic mechanical analysis, when loaded to 1 N to 18 N with a loading rate of 0.1 N/min at a temperature of 25° C.

The wafer may have a creep compliance of 0.60 $\mu m^2/N$ to 0.63 $\mu m^2/N$ when loaded to 1 N with a loading rate of 0.1 N/min at a temperature of 25° C.

The wafer may have a creep compliance of 0.52 $\mu m^2/N$ to 0.55 $\mu m^2/N$, as determined by dynamic mechanical analysis, when loaded to 18 N with a loading rate of 0.1 N/min at a temperature of 25° C.

The creep compliance represents the time-dependent size of deformation caused by unit stress.

When the creep compliance of the wafer is as defined above, deformation possibly caused by stress is controlled to an optimal level so that the possibility of damage to the wafer caused by external forces can be minimized and the formation of defects in the wafer can be reduced.

The wafer may have stiffnesses different by 12 kN/m or less or 11 kN/m or less, as determined by dynamic mechanical analysis, when loaded to 1 N and 18 N with a loading rate of 0.1 N/min at a temperature of 25° C. The wafer may have stiffnesses different by 10.5 kN/m or less, as determined by dynamic mechanical analysis, when loaded to 1 N and 18 N with a loading rate of 0.1 N/min at a temperature of 25° C.

The wafer may have a stiffness of 51.3 kN/m to 57.5 kN/m, as determined by dynamic mechanical analysis, when loaded to 1 N with a loading rate of 0.1 N/min at a temperature of 25° C.

The wafer may have a stiffness of 62 kN/m to 68 kN/m, as determined by dynamic mechanical analysis, when loaded to 18 N with a loading rate of 0.1 N/min at a temperature of 25° C.

The wafer may have a stiffness of 51.3 kN/m to 70 kN/m or 54 kN/m to 67 kN/m, as determined by dynamic mechanical analysis, when loaded to 1 N to 18 N with a loading rate of 0.1 N/min at a temperature of 25° C.

When the stiffness of the wafer is as defined above, the degree of deformation possibly caused by external forces is controlled to an optimal level so that a balance between the durability and processability of the wafer can be achieved.

When the relaxation modulus, creep compliance, and stiffness of the wafer are as defined above, the occurrence of deformation and defects of the wafer can be minimized during transport, machining or processing. In addition, the quality of a silicon carbide epitaxial layer to be formed by a subsequent process can be improved.

The wafer can be manufactured from the silicon carbide ingot 100 by cutting as described above.

The rocking angle of the wafer is the same as that described above.

The wafer may have a micropipe (MP) density of 1.5/$cm^2$ or less or 1/$cm^2$ or less.

The wafer may have a threading edge dislocation (TED) density of 10,000/$cm^2$ or less or 8,000/$cm^2$ or less.

The wafer may have a basal plane dislocation (BPD) density of 5,000/$cm^2$ or less or 3,000/$cm^2$ or less.

The thickness of the wafer may be 300 $\mu m$ to 600 $\mu m$, which is suitably applicable to semiconductor devices, but is not limited thereto.

The wafer may be composed substantially of 4H single-crystal SiC.

The wafer may have a diameter of 4 inches or more, 5 inches or more, or 6 inches or more. The wafer may have a diameter of 12 inches or less or 10 inches or less.

When the defect densities of the wafer are as defined above, the wafer is of high quality with few defects and can be used to fabricate a device with excellent electrical or optical properties.

The defect densities of the wafer can be measured by imaging the surface after the addition of an etchant and details are described in the Experimental Examples section that follows.

Method for Producing Silicon Carbide Ingot

In another aspect, a method for producing a silicon carbide ingot according to one or more example embodiments disclosed herein includes the steps of: arranging a raw material 300 and a silicon carbide seed crystal to face each other in a reactor 200 having an internal space (preparation step); controlling the temperature, pressure, and atmosphere of the internal space to sublimate the raw material and grow a silicon carbide ingot 100 from the seed crystal (growth step); and cooling the reactor and recovering the silicon carbide ingot (cooling step) (FIG. 1).

The silicon carbide ingot includes one surface 100 and another surface 120 facing each other. The one surface is defined as an upper surface and is flat or convex. A wafer is prepared from a portion below the one surface.

The wafer may have relaxation moduli different by 450 GPa or less, as determined by dynamic mechanical analysis, when loaded to 1 N and 18 N with a loading rate of 0.1 N/min at a temperature of 25° C.

In the preparation step, a raw material 300 and a silicon carbide seed crystal are arranged to face each other in a reactor 200 having an internal space.

The features of the silicon carbide seed crystal in the preparation step are the same as those described above.

The raw material 300 may be in the form of a powder including a carbon source and a silicon source. The raw material may be a necked or surface carbonized silicon carbide powder.

The reactor 200 may be a container where a reaction for the growth of the silicon carbide ingot occurs. The reactor 200 is specifically a graphite crucible but is not limited thereto. For example, the reactor 200 may include: a body 210 having an internal space and an opening; and a cover 220 corresponding to the opening and closing the internal space. The cover of the crucible may further include a seed crystal holder integrated with or separated from the cover. The silicon carbide seed crystal can be fixed by the seed crystal holder to face the raw material.

The reactor 200 may have a thermal conductivity of 80 W/mK or more, 85 W/mK or more, or 90 W/mK or more. The reactor may have a thermal conductivity of 120 W/mK or less or 110 W/mK or less. If the thermal conductivity of the reactor is less than 80 W/mK or exceeds 120 W/mK, a very high or low temperature gradient may be established in the reactor, posing a risk that the defect density of the final silicon carbide ingot may increase and the elastic modulus and creep properties of the silicon carbide ingot may deteriorate. The use of the reactor whose thermal conductivity is in the range defined above ensures high crystal quality and improved elastic modulus and creep properties of the silicon carbide ingot.

The reactor is surrounded and fixed by a heat insulating material 400. The heat insulating material 400 surrounding the reactor is located in a reaction chamber 500 such as a quartz tube. The internal temperature of the reactor 200 can be controlled by a heater 600 provided outside the heat insulating material and the reaction chamber.

The heat insulating material 400 may have a porosity in the range of 72% to 95%, 75% to 93% or 80% to 91%. The use of the heat insulating material whose porosity is in the range defined above can reduce the formation of cracks in the grown silicon carbide ingot.

The heat insulating material 400 may have a compressive strength of 0.2 MPa or more, 0.48 MPa or more or 0.8 MPa or more. The compressive strength of the heat insulating material may be 3 MPa or less or 2.5 MPa or less. When the compressive strength of the heat insulating material is in the range defined above, good thermal/mechanical stability of the silicon carbide ingot is ensured and the probability of ash occurrence is lowered, achieving high quality of the silicon carbide ingot.

The heat insulating material 400 may include a carbonaceous felt, specifically a graphite felt. The carbonaceous felt may be a rayon- or pitch-based graphite felt.

A vacuum exhauster 700 is in communication with the reaction chamber 500 to control the degree of vacuum in the reaction chamber. A line 810, through which a gas is injected into the reaction chamber, is also in communication with the reaction chamber. A mass flow controller 800 is provided in the line to control the gas injection. By these elements, the flow rates of an inert gas can be controlled in the subsequent growth and cooling steps.

In the growth step, the temperature, pressure, and atmosphere of the internal space are controlled to sublimate the raw material and grow a silicon carbide ingot from the seed crystal.

The growth step can be carried out by heating the reactor 200 and the internal space of the reactor with the heater 600. Simultaneously with or separately from the heating, the internal space may be depressurized to control the degree of vacuum and an inert gas may be injected to induce the growth of the silicon carbide ingot.

The growth step can be carried out at a temperature of 2000° C. to 2600° C. and a pressure of 1 torr to 200 torr. Under these conditions, the silicon carbide ingot can be produced in a more efficient manner.

Specifically, the growth step can be carried out in the reactor 200 where the upper and lower surface temperatures are 2100° C. to 2500° C. and the pressure of the internal space is 1 torr to 50 torr. More specifically, the growth step can be carried out in the reactor where the upper and lower surface temperatures are 2150° C. to 2450° C. and the pressure of the internal space is 1 torr to 40 torr. Even more specifically, the growth step can be carried out in the reactor where the upper and lower surface temperatures are 2150° C. to 2350° C. and the pressure of the internal space is 1 torr to 30 torr.

Under these conditions for the growth step, higher quality of the silicon carbide ingot can be ensured.

The growth step can be carried out by heating the internal space to the temperature range defined above at a rate of 1° C./min to 10° C./min or 5° C./min to 10° C./min.

In the growth step, a predetermined amount of an inert gas may be supplied to the exterior of the reactor 200. A flow of the inert gas may be created in the internal space of the reactor 200. The inert gas may flow from the raw material 300 in the direction towards the silicon carbide seed crystal. Thus, a stable temperature gradient may be established in the reactor and the internal space.

In the growth step, the inert gas may be supplied at a flow rate of 70 sccm or more, 90 sccm or more, or 100 sccm or more. The inert gas may be supplied at a flow rate of 330 sccm or less, 300 sccm or less, or 280 sccm or less. If the flow rate of the inert gas in the growth step is less than 70 sccm, a smooth supply of the raw material for ingot production may not be obtained, posing a risk that crystal polymorphs may be formed and the number of defects may increase. Meanwhile, if the flow rate of the inert gas in the growth step exceeds 330 sccm, the defect densities of the silicon carbide ingot and the wafer may increase and the elastic modulus and creep properties of the wafer may deteriorate. When the flow rate of the inert gas is in the range defined above, a desired temperature gradient of the crucible can be effectively established and the quality, elastic modulus, and creep properties of the ingot can be improved.

The inert gas may be specifically argon, helium or a mixture thereof.

In the cooling step, the silicon carbide ingot 100 grown in the growth step is cooled at a predetermined rate under a flow of an inert gas.

The cooling step can be carried out at a rate of 1° C./min to 10° C./min or 1° C./min to 5° C./min.

In the cooling step, the pressure of the internal space of the reactor 200 may be controlled simultaneously when the silicon carbide ingot is cooled. Alternatively, the pressure control may be executed separately from the cooling of the silicon carbide ingot. The pressure of the internal space can be controlled to a maximum of 760 torr.

A predetermined amount of an inert gas may be supplied to the reactor 200 in the cooling step, like in the growth step. A flow of the inert gas may be created in the internal space of the reactor. The inert gas may flow from the raw material 300 in the direction towards the silicon carbide seed crystal.

In the cooling step, the inert gas may be supplied at a flow rate of 1 sccm or more, 50 sccm or more, or 100 sccm or more. The inert gas may be supplied at a flow rate of 300 sccm or less, 280 sccm or less, or 250 sccm or less. If the flow rate of the inert gas in the cooling step is 1 sccm or less, a high temperature gradient may be established upon cooling, posing a risk that cracks are likely to occur in the ingot. Meanwhile, if the flow rate of the inert gas exceeds 300 sccm, cracks are likely to occur in the ingot due to the rapid cooling. When the flow rate of the inert gas is in the range defined above, a deterioration in the quality of the ingot can be minimized upon cooling and good elastic modulus and creep properties of the ingot can be achieved.

The growth of the silicon carbide ingot may vary depending on the size and type of the reactor 200 and the state of the raw material and the quality of the silicon carbide ingot may also vary depending on the temperature gradient and pressure of the internal space of the reactor and the gas flow rate. In example embodiments, the flow rate of the inert gas and the thermal conductivity of the crucible are optimized to improve the quality of the silicon carbide ingot.

The features of the silicon carbide ingot produced by the method according to one or more example embodiments and the wafer manufactured from the silicon carbide ingot are the same as those described above.

Method for Manufacturing Wafer

In yet another aspect, a method for manufacturing a wafer according to one or more example embodiments disclosed herein includes the steps of: grinding the edge of a silicon carbide ingot 100 produced by the previous method (grinding step); and cutting the ground silicon carbide ingot into a wafer (cutting step).

In the grinding step, the outer diameter surface of the silicon carbide ingot can be ground to at least 5% of the cross-sectional area of the silicon carbide ingot in a direction inward from the maximum outer diameter surface.

The grinding step can be carried out such that the silicon carbide ingot has a uniform cross section in a direction from the edge of the one surface 110 of the silicon carbide ingot towards the other surface 120 along the central axis.

The cutting step can be carried out such that the silicon carbide ingot is cut at a predetermined off angle with respect to the other surface 120 or the (0001) plane thereof.

The off angle in the cutting step is the same as that described above.

The cutting step can be carried out such that the wafer has a thickness 300 µm to 600 µm, but example embodiments are not limited thereto.

The method may further include the step of planarizing the wafer after the cutting step.

The method may further include the step of grinding the edge of the wafer after the cutting step.

The method may further include the step of etching and polishing the surface of the wafer after the cutting step.

The planarization, grinding, and surface processing steps can be carried out in an appropriate order by respective suitable methods known in the art. For example, the planarization, grinding, and surface processing steps may be carried out in this order.

The features of the wafer manufactured by the method for manufacturing a wafer according to one or more example embodiments are the same as those described above.

Example embodiments will be explained in more detail with reference to the following examples. However, these examples are merely illustrative to assist in understanding example embodiments and are not intended to limit the scope of example embodiments.

Growth of Silicon Carbide Ingots 100

The system illustrated in FIG. 1 was used to produce silicon carbide ingots. First, a silicon carbide powder as a raw material 300 was loaded into the lower portion of the internal space of the reactor 200 and a silicon carbide seed crystal was arranged in the upper portion of the internal space. Here, the silicon carbide seed crystal was composed of a 4H SiC crystal having a diameter of 6 inches and was fixed such that its C plane (000-1) was directed towards the silicon carbide raw material arranged in the lower portion of the internal space. The same applied to Examples 1-4 and Comparative Example 1.

The reactor 200 was sealed, surrounded by the heat insulating material 400, and arranged in a quartz tube reaction chamber 500 provided with a heating coil as an external heater 600. The internal space of the reactor was evacuated to a vacuum, argon gas was introduced into the internal space until the internal space reached 760 torr, and the internal space was depressurized. Simultaneously with the depressurization, the internal space was heated at a rate of 5° C./min to 2300° C. The amount of argon gas flowing in the quartz tube was controlled through the line 810 in communication with the quartz tube using the vacuum exhauster 700. A silicon carbide ingot 100 was grown on the silicon carbide seed crystal facing the silicon carbide raw material at a temperature of 2300° C. and a pressure of 20 torr for 100 h.

After growth, the temperature of the internal space was reduced to 25° C. at a rate of 5° C./min and simultaneously the pressure of the internal space was adjusted to 760 torr. The amount of argon gas flowing in the quartz tube was controlled through the line 810 in communication with the quartz tube using the vacuum exhauster 700. The flow rate of the gas is shown in Table 1.

Manufacture of Wafers

The periphery of the cooled silicon carbide ingot was ground to an outer diameter corresponding to 95% of the maximum outer diameter and processed into a cylindrical shape with a uniform outer diameter. The processed silicon carbide ingot was cut at an off angle of 4° with respect to its (0001) plane to manufacture a 360 µm thick wafer sample.

Measurement of Defect Densities of the Wafers

The wafer sample was cut to a size of 50 mm×50 mm and etched by immersion in molten potassium hydroxide (KOH) at 500° C. for 5 min. Surface defects were imaged by optical microscopy. Shell pits, small hexagonal pits, and black large hexagonal pits were classified as basal plane dislocations (BPDs), threading edge dislocations (TEDs), and micropipes (MPs), respectively.

Twelve areas (500×500 µm each) in the cut wafer sample were arbitrarily selected and the numbers of the defects in each area was measured. The average numbers of the defects per unit area and the densities of the defects were calculated. The results are shown in Table 1.

Figure 3:
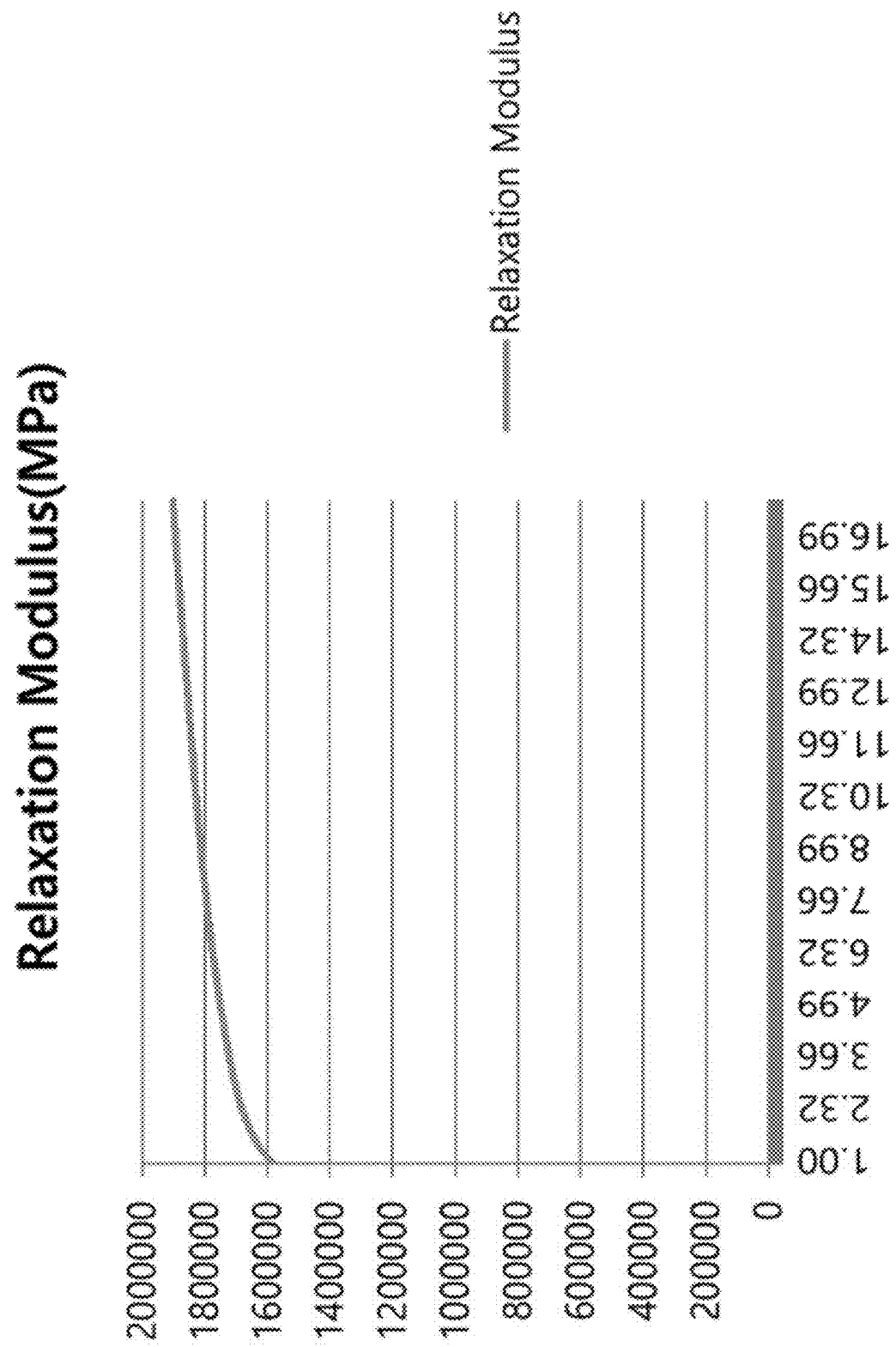
FIG. 3 shows a change in the relaxation modulus (MPa, y-axis) of a wafer produced in Example 1 with varying loads from 1 N to 18 N (x-axis) at a loading rate of 0.1 N/min.
Figure 4:
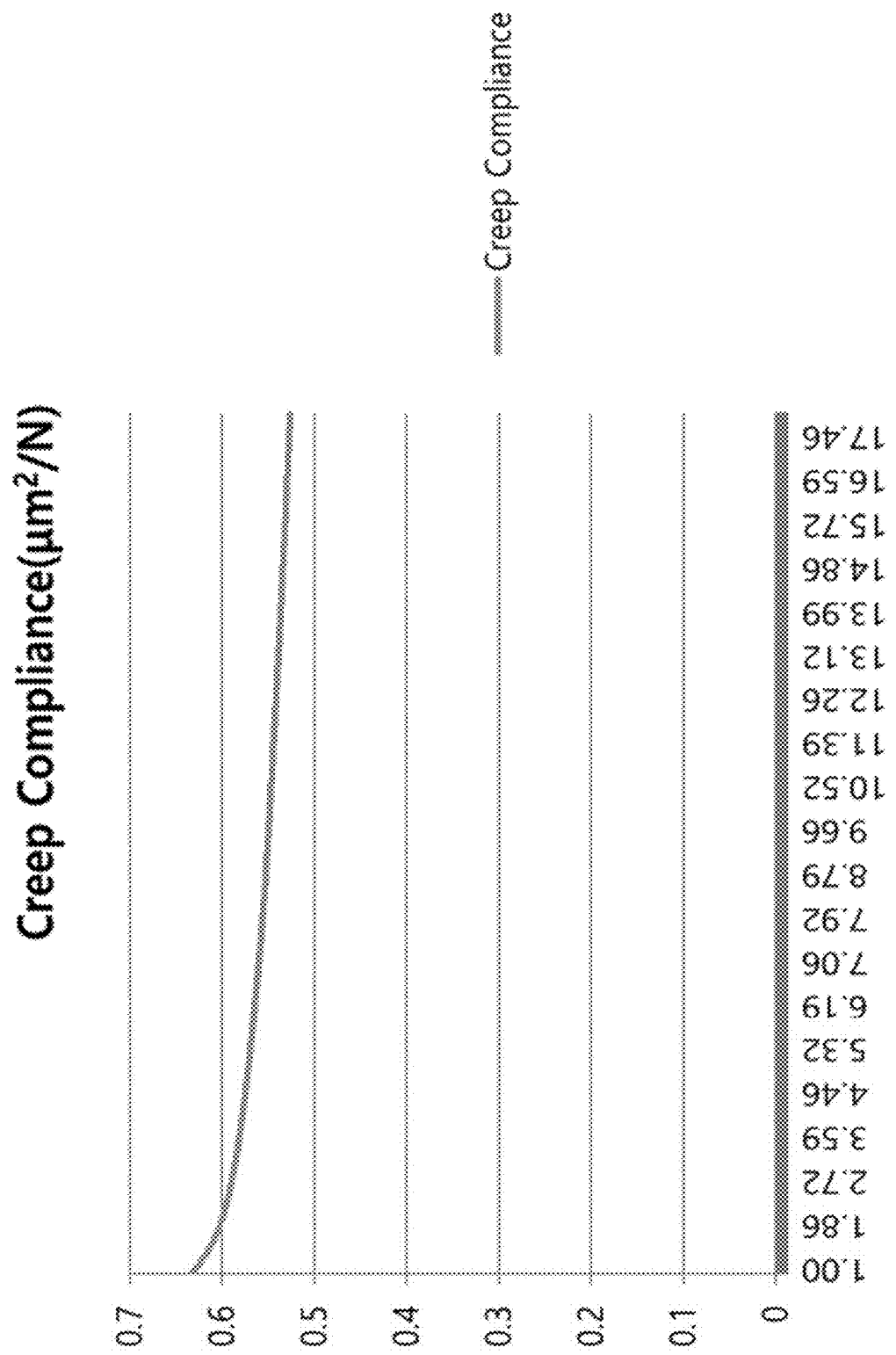
FIG. 4 shows a change in the creep compliance ($\mu m^2/N$, y-axis) of a wafer produced in Example 1 with varying loads from 1 N to 18 N (x-axis) at a loading rate of 0.1 N/min.
Figure 5:
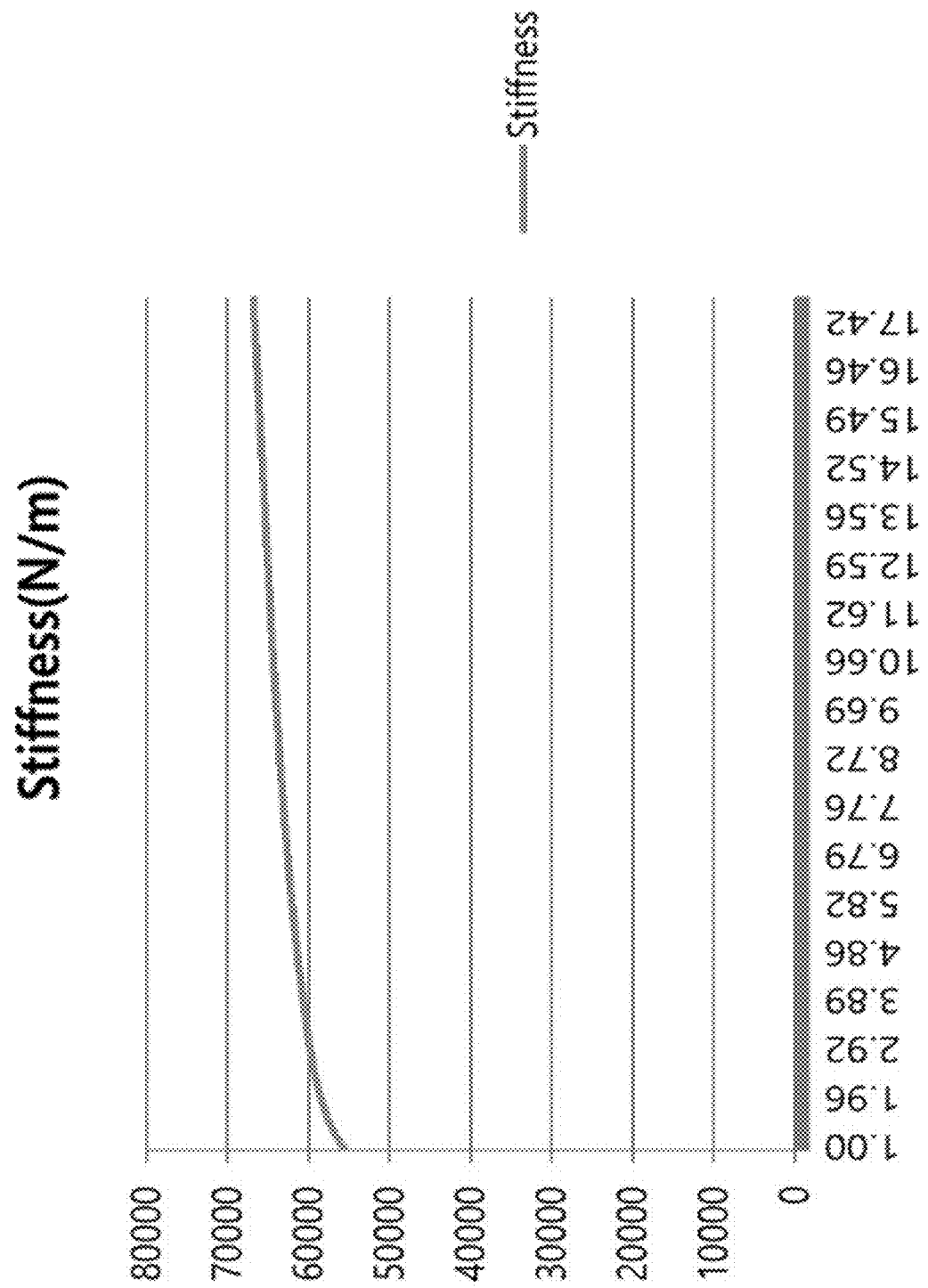
FIG. 5 shows a change in the stiffness (N/m, y-axis) of a wafer produced in Example 1 with varying loads from 1 N to 18 N (x-axis) at a loading rate of 0.1 N/min.

Measurement of Relaxation Moduli, Creep Compliances and Stiffnesses of the Wafers The wafer sample was cut to a size of 60 mm×10 mm and subjected to dynamic mechanical analysis (DMA) while being loaded to 1 N to 18 N with a loading rate of 0.1 N/min at a temperature of 25° C. The dynamic mechanical analysis was performed using a Q800 DMA (TA INSTRUMENTS). The results are shown in Table 2. The results on Example 1 in Table 2 are graphically shown in FIGS. 3 to 5.

TABLE 1

|  | Flow rate of Ar in growth step (sccm) | Flow rate of Ar in cooling step (sccm) | Thermal conductivity of crucible (W/mK) | MP (counts/cm$^2$) | TED (counts/cm$^2$) | BPD (counts/cm$^2$) |
| --- | --- | --- | --- | --- | --- | --- |
| Example 1 | 200 | 200 | 95 | 1 | 7920 | 3000 |
| Example 2 | 200 | 200 | 95 | 1 | 7880 | 2920 |
| Example 3 | 250 | 200 | 95 | 1 | 7980 | 2920 |
| Example 4 | 150 | 150 | 120 | 1 | 7880 | 2880 |
| Comparative Example 1 | 500 | 500 | 95 | 104 | 64880 | 32240 |

MP: micropipes,
TED: threading edge dislocations,
BPD: basal plane dislocations

TABLE 2

|  | Relaxation modulus (GPa) | | Creep compliance (µm$^2$/N) | | Stiffness (kN/m) | |
| --- | --- | --- | --- | --- | --- | --- |
|  | 1N | 18N | 1N | 18N | 1N | 18N |
| Example 1 | 1580 | 1900 | 0.627 | 0.526 | 55.50 | 66.77 |
| Example 2 | 1570 | 1920 | 0.625 | 0.522 | 55.41 | 65.25 |

TABLE 2-continued

| | Relaxation modulus (GPa) | | Creep compliance (μm²/N) | | Stiffness (kN/m) | |
|---|---|---|---|---|---|---|
| | 1N | 18N | 1N | 18N | 1N | 18N |
| Example 3 | 1550 | 1890 | 0.624 | 0.524 | 54.56 | 64.56 |
| Example 4 | 1580 | 1910 | 0.625 | 0.523 | 54.55 | 64.79 |
| Comparative Example 1 | 1500 | 1810 | 0.611 | 0.507 | 53.22 | 63.42 |

Referring to Tables 1 and 2, the wafers of Examples 1-4, which were manufactured using the gas at a flow rate of 150-250 sccm in the growth and cooling steps, showed low defect densities and high relaxation moduli, creep compliances, and stiffnesses. The relaxation moduli of the wafers of Examples 1~4 measured at a load of 1 N were different from those measured at a load of 18 N by –350 GPa. Therefore, it is believed that the occurrence of deformation and distortion in the wafers will be minimized during machining, transport, and processing or under time-dependent loading conditions.

In contrast, large numbers of defects were observed in the silicon carbide ingot produced in Comparative Example 1 due to the excessive flow rate (500 sccm) of the gas in the growth and cooling steps.

According to the example embodiments described herein, excessive deformation and breakage of the wafer can be minimized when external physical factors are applied while maintaining its excellent physical properties. In addition, less stress remains in the wafer of the example embodiments.

In the method for producing a silicon carbide ingot according to example embodiments described herein, process conditions are controlled to produce a silicon carbide ingot that is excellent in elastic modulus and creep properties and has a low defect density.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A wafer comprising relaxation moduli different by 450 GPa or less, as determined by dynamic mechanical analysis, when loaded to 1 N and 18 N with a loading rate of 0.1 N/min at a temperature of 25° C.

2. The wafer according to claim 1, wherein the wafer comprises a creep compliance of 0.508 μm²/N to 0.643 μm²/N, as determined by dynamic mechanical analysis, when loaded to 1 N to 18 N with a loading rate of 0.1 N/min at a temperature of 25° C.

3. The wafer according to claim 1, wherein the wafer comprises a relaxation modulus of 1510 GPa to 1800 GPa when loaded to 1 N with a loading rate of 0.1 N/min at a temperature of 25° C.

4. The wafer according to claim 1, wherein the wafer comprises a relaxation modulus of 1800 GPa to 1960 GPa when loaded to 18 N with a loading rate of 0.1 N/min at a temperature of 25° C.

5. The wafer according to claim 1, wherein the wafer comprises a relaxation modulus of 1510 GPa to 1960 GPa when loaded to 1 N to 18 N with a loading rate of 0.1 N/min at a temperature of 25° C.

6. The wafer according to claim 1, wherein the wafer comprises a stiffness of 51.3 kN/m to 70.0 kN/m, as determined by dynamic mechanical analysis, when loaded to 1 N to 18 N with a loading rate of 0.1 N/min at a temperature of 25° C.

7. The wafer according to claim 1, wherein the wafer comprises a creep compliance of 0.60 μm²/N to 0.63 μm²/N when loaded to 1 N with a loading rate of 0.1 N/min at a temperature of 25° C.

8. The wafer according to claim 1, wherein the wafer comprises a creep compliance of 0.52 μm²/N to 0.55 μm²/N when loaded to 18 N with a loading rate of 0.1 N/min at a temperature of 25° C.

9. The wafer according to claim 1, wherein the wafer comprises a diameter of 4 inches or more and is composed of 4H silicon carbide.

10. A method for manufacturing a wafer, comprising:
arranging a raw material and a silicon carbide seed crystal to face each other in a reactor comprising an internal space;
controlling the temperature, pressure, and atmosphere of the internal space to sublimate the raw material and grow a silicon carbide ingot from the seed crystal;
cooling the reactor and recovering the silicon carbide ingot;
grinding the edge of the silicon carbide ingot; and
cutting the ground silicon carbide ingot into a wafer,
wherein the silicon carbide ingot comprises one surface and an other surface facing each other,
wherein the one surface is flat or convex,
wherein the wafer is prepared from a portion below the one surface, and
wherein the wafer comprises relaxation moduli different by 450 GPa or less, as determined by dynamic mechanical analysis, when loaded to 1 N and 18 N with a loading rate of 0.1 N/min at a temperature of 25° C.

11. The method according to claim 10, wherein the thermal conductivity of the reactor is 120 W/mK or less.

12. The method according to claim 10, wherein a heat insulating material surrounding an outer surface of the reactor comprises a porosity of 72% to 95%.

13. The method according to claim 10, wherein a heat insulating material surrounding the outer surface of the reactor comprises a compressive strength of 0.2 MPa or more.

14. The method according to claim 10, wherein the wafer comprises a creep compliance of 0.508 μm²/N to 0.643 μm²/N, as determined by dynamic mechanical analysis, when loaded to 1 N to 18 N with a loading rate of 0.1 N/min at a temperature of 25° C.

15. The method according to claim 10, further comprising a flow in a direction from the raw material towards the silicon carbide seed crystal during the cooling.

16. A method of producing an ingot, comprising:
disposing a raw material and a silicon carbide seed crystal facing each other in an internal space of a reactor;
sublimating the raw material to grow a silicon carbide ingot from the seed crystal in the internal space; and
cooling the reactor and recovering the silicon carbide ingot,
wherein during the sublimating, inert gas flows in a direction from the raw material towards the silicon carbide seed crystal at a flow rate of 70 sccm or more and 330 sccm or less, and/or during the cooling inert gas flows in a direction from the raw material towards the silicon carbide seed crystal at a flow rate of 1 sccm or more and 300 sccm or less.

17. A method of manufacturing a wafer, comprising:
grinding the edge of the silicon carbide ingot of claim 16; and
cutting the ground silicon carbide ingot into the wafer,
wherein the wafer comprises relaxation moduli different by 450 GPa or less, as determined by dynamic mechanical analysis, when loaded to 1 N and 18 N with a loading rate of 0.1 N/min at a temperature of 25° C.

18. The method according to claim 16, wherein the thermal conductivity of the reactor is 120 W/mK or less.

19. The method according to claim 16, wherein a heat insulating material surrounding the outer surface of the reactor comprises a porosity of 72% to 95%.

20. The method according to claim 16, wherein a heat insulating material surrounding the outer surface of the reactor comprises a compressive strength of 0.2 MPa or more.

* * * * *